US008956454B2

(12) United States Patent
Köckeis

(10) Patent No.: US 8,956,454 B2
(45) Date of Patent: Feb. 17, 2015

(54) METHOD AND DEVICE FOR PRODUCING MATERIAL HAVING A MONOCRYSTALLINE OR MULTICRYSTALLINE STRUCTURE

(75) Inventor: Rupert Köckeis, Schönberg (DE)

(73) Assignee: Streicher Maschinenbau GmbH & Co. KG, Deggendorf (DE)

(*) Notice: Subject to any disclaimer, the term of this patent is extended or adjusted under 35 U.S.C. 154(b) by 0 days.

(21) Appl. No.: 14/110,478

(22) PCT Filed: Mar. 21, 2012

(86) PCT No.: PCT/EP2012/054963
§ 371 (c)(1),
(2), (4) Date: Oct. 21, 2013

(87) PCT Pub. No.: WO2012/139865
PCT Pub. Date: Oct. 18, 2012

(65) Prior Publication Data
US 2014/0048011 A1    Feb. 20, 2014

(30) Foreign Application Priority Data
Apr. 11, 2011   (DE) .................. 10 2011 007 149

(51) Int. Cl.
*C30B 15/02*  (2006.01)
*C30B 15/14*  (2006.01)
*C30B 15/08*  (2006.01)
*C30B 28/10*  (2006.01)

(52) U.S. Cl.
CPC .............. *C30B 15/14* (2013.01); *C30B 15/08* (2013.01); *C30B 28/10* (2013.01); *Y10S 117/91* (2013.01)

USPC .................................. 117/13; 117/20; 117/910

(58) Field of Classification Search
USPC .............................................. 117/13, 20, 910
See application file for complete search history.

(56) References Cited

U.S. PATENT DOCUMENTS

| 4,108,714 | A |   | 8/1978  | Keller et al.           |
|-----------|---|---|---------|-------------------------|
| 4,216,186 | A | * | 8/1980  | Frosch et al. ... 117/211 |
| 4,367,200 | A | * | 1/1983  | Mimura et al. ... 117/205 |
| 4,590,043 | A | * | 5/1986  | Sanjurjo ........ 117/223 |
| 4,834,832 | A | * | 5/1989  | Stock et al. ...... 117/16 |
| 6,402,834 | B1| * | 6/2002  | Nagai et al. ....... 117/13 |

FOREIGN PATENT DOCUMENTS

| DE | 1204837  | 11/1965 |
| DE | 4216519  | 2/1993  |
| DE | 19538020 | 4/1997  |
| EP | 0634504  | 1/1995  |
| FR | 1387497  | 1/1965  |
| JP | 62246894 | 10/1987 |

* cited by examiner

*Primary Examiner* — Bob M Kunemund
(74) *Attorney, Agent, or Firm* — Boyle Fredrickson S.C.

(57) ABSTRACT

According to the invention, a device and a method for producing materials having a monocrystalline or multicrystalline structure are provided, in which a container is arranged between two pressure regions and the setting of the height of the melt in the container takes place via the setting of the differential pressure between the pressure regions. As a result, even particulate material can be fed continuously to the container and melted uniformly. Delivery material with high purity can also be pulled out of the container.

6 Claims, 6 Drawing Sheets

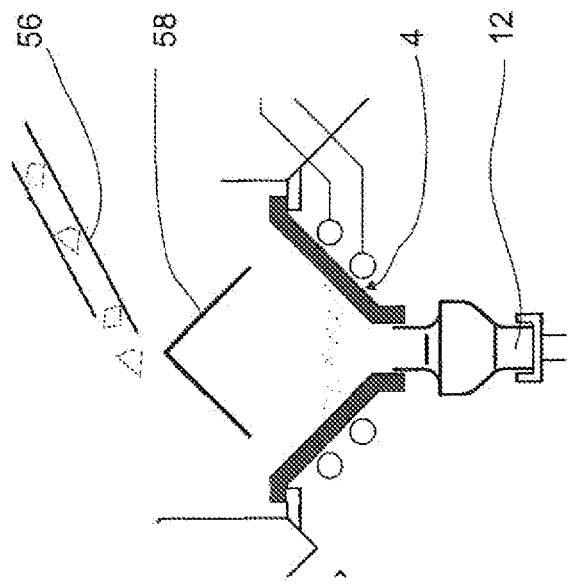
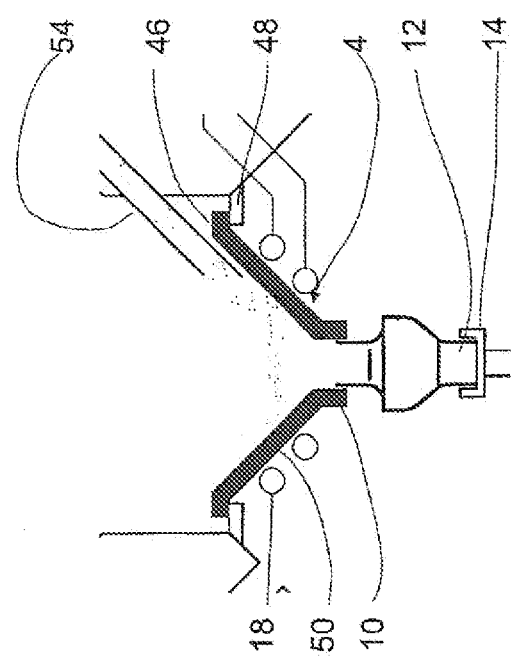
Fig. 2A
Fig. 2B

METHOD AND DEVICE FOR PRODUCING MATERIAL HAVING A MONOCRYSTALLINE OR MULTICRYSTALLINE STRUCTURE

BACKGROUND OF THE INVENTION

1. Field of the Invention

The present invention relates to a device and a method for producing material having a monocrystalline or multicrystalline structure. The device according to the invention and the method according to the invention are preferably used for the production of monocrystalline silicon.

2. Description of Related Art

A multiplicity of production methods for semiconductor-compatible silicon, particularly for use in photocells, are known from the prior art. For example, the method of melting multicrystalline silicon in a quartz crucible, the Czochralski method and the zonal pulling method are known.

After multicrystalline silicon has been melted in a quartz crucible, slow cooling takes place, which entails disadvantages as regards quality. There are therefore innumerable crystalline regions with different sizes, with the result that the initial product is a multicrystal. The advantage of this melting method is that a large quantity of silicon, for example 800 kg, can be melted in one operation. However, since there is no monocrystal at the end of the crystallization process, preferred semiconductor properties of the resulting multicrystal are not obtained because of the many crystal lattice changes.

In the Czochralski method, which is also designated as a crucible pulling method, silicon is melted in a crucible at a temperature lying slightly above the melting point and a crystal is then pulled out of the melt by turning via a monocrystalline inoculant. This gives rise to a monocrystal having substantially better crystal properties for use in photocells, as compared with the melting of multicrystalline silicon in a quartz crucible.

Both melting in a quartz crucible and the Czochralski method have many disadvantages:

On account of the long dwell time in the quartz crucible, oxygen is released from the quartz crucible in the silicon melt. These oxygen atoms are incorporated into the crystal. When graphite heaters are used for the crucible in order to maintain the temperature, carbon atoms are sublimated into the inert gas atmosphere and are released in the melt. In this case, too, these are incorporated into the crystal. This causes the semiconductor properties to be influenced adversely, with the result that the lifetime of free electrons is seriously reduced, thus causing a reduction in the efficiency of a photocell produced on the basis of this material.

The qualitative disadvantages of the melting method and of the Czochralski method are overcome in the zonal pulling method. The zonal pulling method is also designated as a float zone method.

In the zonal pulling method, heating takes place by induction heating. More specifically, a multicrystalline silicon rod is guided along an induction coil. The silicon rod is remelted from the bottom upward into a monocrystal. The resulting monocrystal has high purity. The advantages of the zonal pulling method are that, in contrast to the Czochralski method and melting method, no adverse material properties with regard to electron lifetime arise. Furthermore, the required energy input is lower because only a limited zone of silicon is melted and substantially lower radiation losses therefore occur.

The disadvantage of the zonal pulling method is that polycrystalline rods of high quality are necessary as initial material. Thus, in the zonal pulling method, the polyrods are subject to high requirements as regards geometrical form and freedom from cracks. A large amount of time has to be spent in order to produce these high-quality polyrods, with the result that high production costs are incurred.

An attempt is made in laid-open publication DE 42 165 19 A1 to link the advantages of the zonal pulling method to the advantages of a process for the beneficial production of multisilicon. More specifically, granular silicon is introduced from above into a reusable silicon tube. This silicon enters the melting zone which closes off the silicon tube and in which heating takes place by induction heating.

The disadvantage of the method according to DE 42 165 19 A1 is that there are stringent requirements for a homogeneous material quality and there has to be a highly controlled material tracking. This material tracking is intended to prevent an uncontrolled escape of the melt and a subsequent possible termination of the entire remelting operation.

SUMMARY OF THE INVENTION

The object of the present invention is to provide a device and a method for producing material having a monocrystalline or multicrystalline structure, in which the disadvantages of the prior art are overcome. In particular, monocrystalline or multicrystalline materials of high quality are to be produced.

Furthermore, robustness with respect to fluctuations in delivery is to be achieved by means of the invention, and, preferably, the possibility of delivering initial material continuously is to be afforded. In the case of particular refinements of the invention, monocrystalline silicon rods are to be produced without the use of polysilicon rods which are complicated to produce. By particulate polysilicon fractions capable of being produced favorably being used, the disadvantages of the costly use of polycrystalline rods are preferably to be avoided.

The stated object is provided by means of a method as claimed, and a device as claimed.

The embodiments according to the invention are contained in the subclaims.

Assessment of the Claims

According to the first aspect of the present invention, a method for producing material having a monocrystalline or multicrystalline structure is provided, having the steps:

introduction of a particulate material mixture into an inlet of a container, heating of the material mixture in a melting zone of the container, and static support of the material mixture in the melting zone via a pressure difference between the inlet and an outlet of the container.

Continuous melting of materials can thereby be implemented. The possibility of using materials having an initial, granular basis is also advantageous.

In the method according to the invention, corresponding to the first aspect above, according to a second aspect it is preferred that the static support takes place between two chambers which are separated by the container and between which the pressure difference prevails. What is advantageous in this refinement is that either each of the chambers is regulated separately in terms of pressure or these chambers are connected to one another by regulating the pressure difference. The pressure difference can consequently be implemented at low outlay in terms of apparatus.

According to a refinement of the third aspect of the method according to the invention, each of the present aspects can be developed in that contacting the material mixture, preferably in the melting zone, with an inoculating crystal takes place at or adjacent to the outlet of the container. As a result, in material production, the advantages of the zonal pulling method can be achieved. Furthermore, the zone for melting and the zone for pulling the crystal can thus also be separated, which makes it possible to have an increased volume of the container out of which pulling takes place, if this is not a continuous flow container.

According to a fourth aspect, in the case of one of the three aspects above, pulling of the inoculating crystal or inoculant out of the melting zone in order to form a monocrystalline semiconducting silicon rod may take place. Silicon of high purity can thus be obtained at low outlay in terms of apparatus.

According to a fifth aspect which develops one of the first to third aspects the material is a semiconducting material, a connecting semiconductor and/or a metal alloy. The continuous provision of melted material is thus possible at low outlay in terms of apparatus.

According to a sixth aspect, which develops the fourth aspect, the particulate material mixture may have particulate silicon and the semiconducting material generated may be multicrystalline silicon. Thus, the conventional zonal pulling method can be replaced efficiency by the method with differential pressure support.

The seventh aspect of the present invention, which develops the fourth aspect, may have a particulate material mixture in the form of particulate silicon. Furthermore, in this the semiconducting material generated is monocrystalline silicon which, according to an eighth aspect, is preferably in the form of a silicon rod. It is thus possible to replace the conventional zonal pulling method.

In the method corresponding to one of the present eight aspects, according to a ninth aspect the setting of the differential pressure by differential pressure regulation may take place. It is thus possible at low outlay in terms of apparatus to maintain the height of the melt in the container at a specific value.

As an alternative to the ninth aspect, according to a tenth aspect, one of the first to eight aspects above may be developed in that the differential pressure is set via two absolute pressure controllers. The advantage here is complete decoupling of the pressure regions on both sides of the container.

According to an eleventh aspect, one of the first to tenth aspects may be developed in that the volume of material in the container is measured by height measurement. The level in the melting crucible when a cone-like crucible is used can thereby be determined by diameter determination.

A device according to the present invention may be designed, according to a twelfth aspect of the invention, to produce material having a monocrystalline or multicrystalline structure and may have: a container having an inlet, via which a particulate material mixture can be introduced, a heating arrangement, by means of which the material mixture can be heated in a melting zone of the container, and a pressure generation arrangement for generating a pressure difference between the inlet and the outlet of the container, via which pressure difference the material mixture in the melting zone can be supported statically. As a result, the height of the melt in the container can be set at low outlay in terms of apparatus. Furthermore, a structure of the material generated can be produced with high purity.

The device corresponding to the twelfth aspect may be developed in that two chambers are provided, which are separated by the container and between which the pressure difference prevails. Continuous material generation with high purity is consequently possible at low outlay in terms of apparatus.

The device corresponding to the twelfth and thirteenth aspect may be developed, according to a fourteenth aspect, in that a differential pressure regulating arrangement is provided, via which the differential pressure between the two chambers can be regulated. Differential pressure regulation to set a differential pressure between two vacuum containers is thereby possible. The outlay for this in control terms is low.

As an alternative to differential pressure regulation according to the fourteenth aspect, in a fifteenth aspect which develops the device according to the twelfth and thirteenth aspect two absolute pressure regulating arrangements may be provided, which are assigned to a respective chamber and via which the differential pressure between the two chambers can be regulated. By means of the two absolute pressure regulating arrangements, it is possible to provide two completely separate chambers, via which the advantageous setting of the height of the level in the melting zone in the container is possible.

In a device corresponding to one of the twelfth to fifteenth aspects, an inoculating crystal or inoculant may be provided, via which the material mixture, preferably in the melting zone, can be contacted at or adjacent to an outlet of the container and via which the semiconducting material can be pulled out of the melting zone. Thus, in the zonal pulling method, a continuous material flow can be produced in a simple way and likewise be used, for example, to form monocrystalline silicon. Furthermore, the zone for melting and the zone for pulling the crystal can thus also be separated, which makes it possible to have an increased volume of the container out of which pulling takes place, when this is not a continuous flow container.

According to a sixteenth aspect, which develops one of the twelfth to fifteenth aspects, the material is a semiconducting material, a connecting semiconductor and/or a metal alloy. Thus, in the case of different materials, a pure initial product can be implemented by means of a configuration which is simple in terms of apparatus.

In a device corresponding to the eighteenth aspect of the invention, which develops a device corresponding to the twelfth to sixteenth aspects, the particulate material mixture is particulate silicon and the semiconducting material generated is multicrystalline silicon. Material can thus be generated continuously with a high output rate and homogeneity.

As an alternative to the eighteenth aspect, in a nineteenth aspect, by which the device according to one of the twelfth to seventeenth aspects is developed, the particulate material mixture has particulate silicon and the semiconducting material generated is monocrystalline silicon. Monocrystalline silicon can thus be generated continuously with higher purity at low outlay in terms of apparatus.

In this case, according to a twentieth aspect, it is preferred that the monocrystalline semiconducting material of the nineteenth aspect is a silicon rod. The device according to the invention can thus advantageously be used in the zonal pulling method instead of the corresponding device.

According to a twenty-first aspect, the device of one of the twelfth to twentieth aspects is developed with a throttling arrangement which is dimensioned such that a maximum differential pressure can be fixed between the chambers. An overflow of the melt in the container can thereby be prevented.

The device corresponding to the twenty-first aspect may be developed, according to a twenty-second aspect, such that it has a differential pressure regulating valve which is connected in parallel to the throttling arrangement and via which the differential pressure between the chambers can be reduced. The height of the melt in the container can thus be set so as to be adapted more closely to the actual course of the process.

According to a twenty-third aspect, which develops one of the twelfth to twenty-second aspects, the particulate silicon has silicon particles with an edge length of at most 20 mm, more preferably of less than 10 mm and most preferably of less than or equal to 5 mm. Coarse broken silicon can thus be used to generate monocrystalline silicon at low outlay in terms of apparatus and to achieve a high purity.

According to a twenty-fourth aspect, which develops one of the twelfth to twenty-third aspects the container is designed conically, thus ensuring that the melt flows on towards the outlet of the container effectively. Furthermore, the height measurement in the container can be implemented in a simple way.

According to a twenty-fifth aspect, the measurement of the volume of the material in the container takes place by height measurement. One of the twelfth to twenty-fourth aspects is thereby developed. The outlay for measuring the volume of the melt can consequently be reduced.

In one of the twelfth to twenty-fifth aspects, the capacity of the container may amount to at most 1 $dm^3$. Thus, according to the refinement of the present invention, good height level regulation means that only a small volume is necessary in order nevertheless to ensure a continuous flow out of the melting zone with high accuracy. As a result, effects of the material of the melting crucible or from the surroundings of the pressure regions upon the container can be reduced.

According to a twenty-seventh aspect which develops one of the twelfth to twenty-sixth aspects, the preferred material of the container is a material which is resistant to a temperature of up to 1430° C. Interaction between the melt in the container and the container material is thus minimized.

According to a twenty-eighth aspect, which develops one of the twelfth to twenty-seventh aspects, the container has a coating which preferably has silicon carbide or silicon nitride. The interaction between the container and the material in the melting zone can be further reduced by means of a coating of this type.

According to a twenty-ninth aspect, which develops one of the twelfth to twenty-eighth aspects, the measurement of the volume of the material in the container takes place via a measurement of the diameter of the material in the container. A camera arrangement may thereby be used for volume measurement, in which the volume can be deduced from the diameter by means of the cone-like inner surface of the container.

According to a thirtieth aspect, which develops one of the twelfth to twenty ninth aspects, the device has a differential pressure regulating arrangement, via which the differential pressure between the two chambers can be controlled or regulated, and preferably a differential pressure control arrangement which connects the two chambers and via which the differential pressure between the two chambers can be controlled or regulated. The differential pressure can thus be set in a simple way.

These and other features and advantages of the invention will become apparent to those skilled in the art from the following detailed description and the accompanying drawings. It should be understood, however, that the detailed description and specific examples, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

The invention is described below by means of preferred exemplary embodiments, with reference to the drawings in which:

FIG. 2A shows a detail A from FIG. 1 according to the first exemplary embodiment, FIG. 2B shows a modification of the detail A from FIG. 1 according to the first exemplary embodiment.

DETAILED DESCRIPTION OF THE PREFERRED EMBODIMENTS

Devices and methods for producing material preferably having a monocrystalline or multicrystalline structure are described in more detail below, with reference to three exemplary embodiments and modifications of these.

The present invention can not only be used for producing semiconductor materials, such as germanium and silicon, but also for the production of connecting semiconductors, such as indium phosphide and gallium arsenide, and indeed for the production of crystals, metals and alloys of these. For the sake of simplicity, the description of the exemplary embodiments refers below to the production of monocrystalline silicon. However, this is in no way to be interpreted restrictively, and the invention can also be used for producing other materials described by way of example above.

Preferably, by means of the method according to the invention, monocrystalline high-purity semiconductor silicon, preferably used in microelectronics and photovoltaics is to be produced. For such requirements, impurities have to be bought below critical values by means of elements which are suitable as doping elements in silicon.

The present invention is intended preferably to make it possible to use silicon particles. These have coarse and irregular granularity. It is also to be possible by means of the method according to the invention to use silicon with a surface which has properties resembling those of broken silicon. In particular, it is advantageous to use fragments with an edge length of up to 20 mm, more preferably of up to 10 mm and most preferably with a grain size of up to 5 mm.

In the production process in the application using silicon, the present invention is employed after the separation of polycrystalline highest-purity silicon and can preferably be used to generate monocrystalline silicon.

The present invention develops the zonal pulling method in which impurity atoms conventionally settle at the end of the silicon column and these impurity atoms are removed after cooling.

Figure 1:
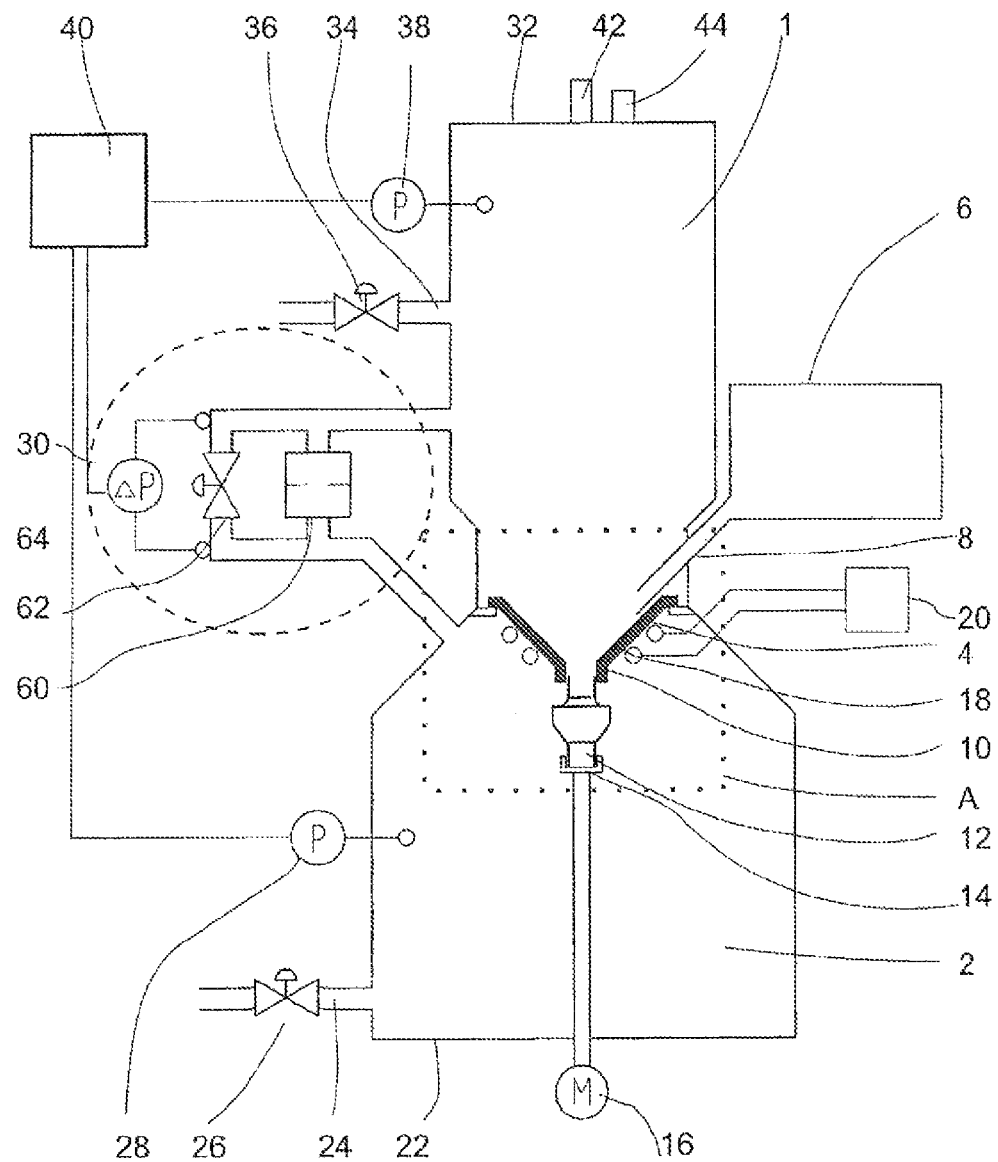
FIG. 1 shows a diagrammatic view of elements of a device for material production according to the first exemplary embodiment.

In contrast to the conventional zonal pulling method, in the present invention two pressure regions, preferably overpressure regions, 1 and 2 are used, which are separated from one another by a crucible 4, as shown in FIG. 1. On account of different pressures in the pressure regions 1 and 2, there is static support of a liquid melt of the initial material of the invention above the container which in this example is configured as a crucible 4.

Particulate silicon passes out of a reservoir 6 via a conveying arrangement 8 into the crucible 4 in which the silicon is melted. The silicon flows out of the crucible 4 via an outlet and is melted on an inoculant 12 as monocrystalline silicon. The particulate silicon may, for example, have a granular quality resembling round grains or be broken silicon.

The inoculant 12 is located on an inoculant holder 14 and is set in rotation or pulled downward via the latter. When the inoculant 12 is pulled, the silicon leaving the crucible 4 as a molten flow is replaced continuously from the reservoir 6 via the conveying arrangement 8.

The crucible 4 has the function of a dynamic buffer, via which as constant a melting flow as possible in the direction of the monocrystalline inoculant 12 is made possible. Decoupling of disturbance variables on the conveying side is thereby implemented.

At the crucible 4, pressure decoupling takes place between the top side of the crucible, that is to say the filling side, in the pressure region 1 and the underside of the crucible in the pressure region 2 in which the molten silicon leaves the crucible. A pressure difference is consequently established between the pressure region 1 and the pressure region 2 via the crucible. This pressure difference has the function of storing a defined quantity of molten silicon in the crucible 4 and of thereby forming a dynamic buffer.

The inoculant holder 14 is set in rotation via a drive system 16.

The heating of the crucible 4 preferably takes place via an induction coil 18 which is supplied via an induction generator 20.

The pressure region 2 is located in a lower pressure vessel 22 having an inlet 24, via which the fluid feed takes place via a control valve 26.

In the present invention, the fluid preferably used is an inert gas, such as, for example, argon gas. However, any other fluid, by means of which a pressure difference can be maintained above the crucible 4, may be employed. It is preferable if the fluid does not come into interaction at all, or at least only slightly, with the material to be produced. For the sake of simplicity, the fluid is referred to below as an inert gas.

The pressure of the inert gas in the pressure region 2 is measured via a pressure measuring arrangement 28. The pressure region 2 and the upper pressure region 1 are connected fluidically to one another via a connecting system 30 described further below. The pressure region 1 is defined in an upper pressure vessel 32 which has an outlet 34. The pressure at the outlet can be set by means of a control valve 36. A pressure measuring arrangement 38 measures the pressure in the upper pressure region 1. FIG. 1 shows the pressure measuring arrangement 28, 30 and 38 as being connected to a control arrangement 40. It is preferable if the control valves 26 and/or 36 and the control arrangements in the connecting system 30 are also activated via the control arrangement 40 or deliver signals to the latter.

A height signal sensor 42 for receiving a height signal for the level of the melt in the crucible 4 and a temperature signal sensor 44 for measuring the temperature of the melt in the crucible 4 are provided, facing into the upper pressure region 1. The height signal sensor 42 is preferably a camera arrangement, via which a measurement signal can be picked up which makes it possible to deduce the height of the level of the melt in the crucible 4. The temperature signal sensor 44 is preferably a pyrometer.

The region around the crucible 4 from FIG. 1, corresponding to the first exemplary embodiment, is illustrated, enlarged, in FIG. 2A. The crucible 4 is designed as a continuous flow crucible and has a flange portion 46, via which a fluid-tight, preferably gas-tight connection to a separating arrangement 48 can be provided, said separating arrangement separating the upper pressure region 1 and the lower pressure region 1. The separating arrangement 48 is cooled so that effective sealing off between the crucible and the separating arrangement 48 is possible. The crucible tapers conically from the flange portion 46 toward the outlet 10. The outlet 10 in the form of an orifice is arranged at right angles to the longitudinal axis of the inoculant 12. The diameter of the outlet may amount, for example, to one to two centimeters, but may also be made larger, depending on the process. The molten silicon leaves the crucible via the outlet 10. By a continuous flow crucible being used as the crucible 4, it is possible to employ particulate silicon not only with a granular quality resembling that of round grains, but also with features of broken silicon.

Further indications as to the material properties and as to the geometric manufacturing tolerances with regard to the crucible are given below. The crucible material must withstand the melting temperature of the material to be introduced, silicon in the present exemplary embodiment. That is to say, for an application using silicon, a melting temperature of 1430° C. must be withstood. Owing to the crucible material, the diffusion of impurity atoms into the silicon melt is to be minimized, thus placing stringent requirements upon the purity of the crucible material and also having effects upon a possible crucible coating. For example, the material used for the crucible is quartz in the form of fumed silica and a crucible coating is employed. This is, for example, silicon carbide with a thickness of 0.2 to 0.3 mm, which is preferably applied by means of a PVD (physical vapor deposition) depositing method. Alternatively, for example, silicon nitride can also be used for the crucible coating.

The capacity of the conical crucible portion 50 amounts to up to 1 dm$^3$, but may also lie above this value. It is preferable if the crucible volume is as small as possible. The design of the crucible volume depends on the melting time of the silicon particles which depends in turn on the particle size. The longer the melting time, the larger the silicon particles supplied are.

Furthermore, as regards the crucible, there is the requirement that the dwell time of the melt in the crucible is kept short, so that contamination due to the diffusion of impurity atoms, for example oxygen, out of the crucible wall and through the crucible coating into the melt is minimized. For the device according to the invention, it is to be preferred that fluctuations in the particle feed do not influence the continuity of the molten flow. In the event that a pulling rate of 2 mm per minute is assumed, which corresponds to a molten flow of 0.04 dm$^3$ per minute in the case of a silicon crystal with a diameter of 150 mm, the dwell time in the crucible in the case of a crucible volume of 1 dm$^3$ corresponds on average to 25 minutes.

The induction coil 18 is arranged outside the crucible 4, serves to surround the latter essentially in the form of a ring in the conical crucible portion 50 and is fed via the heating arrangement 20 in the form of an induction generator. This induction coil 18 serves for melting the silicon particles.

To commence the process of material production, it is necessary to heat the silicon, for example, to approximately 600° C., for example by radiant heating. The latter may be arranged either above the crucible 4 or below the crucible 4.

The temperature signal sensor 44 in the form of the pyrometer detects the melting temperature and is preferably mounted on the upper pressure vessel 32.

The camera arrangement 42, via the measurement signal of which the level height of the silicon melt in the crucible 4 can be detected, detects the diameter of the silicon melt. This camera arrangement 42 is followed by an image evaluation arrangement, not illustrated, via which the diameter of the silicon melt makes it possible in arithmetic form to deduce the melt height. The camera arrangement 42 and the image evaluation arrangement are preferably coupled to the control arrangement 40, so that, after a melt height measurement, a setting of the delivery quantity via the conveying arrangement 8 can be carried out. Regulation in order to keep the melt level in the crucible 4 constant can be implemented via the setting of the delivery quantity. By means of such regulation, it is possible, according to the present invention, even to convert silicon particles above the particle size of up to 1 mm used in document DE 42 165 19 A1.

For a preferred setting of the delivery quantity, the reservoir 6 is positioned adjacently to the pressure region 1, that is to say above the crucible 4. The reservoir 6 is connected to the crucible 4 via a feed line by means of the conveying arrangement 8. Preferably polycrystalline silicon particles are located in the reservoir 6, and the reservoir 6 and conveying arrangement 8 are preferably assigned to the pressure region 1, that is to say to the space above the crucible 4. The pressure in the reservoir 6 consequently lies at the same pressure $P_{top}$ as the pressure in the pressure region 1.

The inoculant 12 at the outlet 10 of the crucible 4 preferably has inoculating crystals which are monocrystals generated under laboratory conditions and having the same crystal orientation as the desired cultivated crystal at the outlet 10.

It is advantageous if the inside diameter of the crucible at the outlet 10 is larger than the outside diameter of the inoculant 12. The inoculant 12 can thus be moved into the inner recess at the outlet 10 of the crucible and a seal can thereby be formed.

The inoculant 12 is located on the inoculant holder 14 below the outlet 10 of the crucible 4. The inoculant holder 14 is coupled to the drive system 16 via a pulling shaft. Rotation is imparted to the pulling shaft and therefore to the inoculant holder via the drive system 16. The pulling shaft can have its height adjusted via a height control arrangement, not illustrated.

In the device according to the invention, regulation of the diameter of the silicon rod and regulation of the temperature of the silicon at the outlet 10 or of the melt in the crucible 4 are carried out in the same way as in conventional arrangements which operate according to the zonal pulling method. In addition to this diameter and temperature regulation, it is preferable in the present invention to carry out differential pressure regulation between the pressure regions 1 and 2 and also melt level regulation of the melt in the crucible 4. A more detailed explanation of melt level regulation is given below. In the present invention, the crucible 4 operates as a buffer vessel in which the melt level height is effected via differential pressure regulation between the pressure region 1 and pressure region 2, so that the level of the melt in the crucible 4 can oscillate about a fixed melt level. By means of melt level regulation, it is possible that, should the delivery of silicon particles falter, although the melt level would fall slightly, the molten flow does not stall. The molten flow merely diminishes, thus giving rise briefly to a lower crystal growth on the inoculant 12. The lower crystal growth can be compensated by a slower target rate.

When sufficient silicon is subsequently fed to the crucible 4 again, the level of the melt in the crucible 4 rises and the molten flow levels out at the desired value. As a result of melt level regulation, the crucible in the form of a buffer vessel acts as a damping member for the melting zone, so that the overall system has an improved reaction in the event of disturbance in delivery.

In the refinement according to FIG. 2A, the particulate silicon is fed to the crucible 4 via a line 54. Since the end of the feed line 54 is located on a portion of the circumference in the conical crucible portion 50, unevenly melted particles are present on the Outer circumference of the melt in the crucible 4.

In a variant of the first exemplary embodiment, as illustrated in FIG. 2B, the feed line 56 ends approximately on an axis to the inoculant 12. Between the end of the feed line 56 and the crucible 4 is located in apportioning arrangement 58, via which silicon particles can pass out of the end of the feed line 56 into the crucible 4 on at least two outer circumferential portions of the melt in the crucible 4. This is implemented, in the example of FIG. 2B, in the form of two inclined portions. These inclined portions may, for example, be provided rotationally symmetrically over 360°. With the apportioning arrangement 58 in FIG. 2B, it is possible to carry out more uniform melting of the particles in the crucible 4. A further advantage of the apportioning arrangement is that the radiation losses of the melt can be reduced.

In the refinement shown in FIG. 2B, for example, the apportioning arrangement may have provided in it a radial clearance or a plurality of radial clearances, through which visual detection of the extent of the melt in the crucible 4 is possible.

Alternatively to this, the diameter of the apportioning arrangement may be configured such that the melt can be detected visually from above by means of the height signal sensor 42.

The connecting system 30 between the upper pressure region 1 and the lower pressure region 2 is described in more detail below. The function of the connecting system 30 derives from the fact that, when the crucible 4 is filled with a silicon melt, a gas flow between the upper pressure region 1 and the lower pressure region 2 is no longer possible via the outlet 10 of the crucible 4. It is possible via the connecting system 30 to maintain the pressures in the pressure regions 1 and 2. The inert gas can be fed in a defined quantity per unit time to the lower pressure region 2 via the control valve 26 shown in FIG. 1. The gas then flows out of the lower pressure region 2 via the connecting system 30 into the upper pressure region 1. The gas passes out of the upper pressure region 1 via the control valve 36.

In the refinement corresponding to the first exemplary embodiment from FIG. 1, the connecting system 30 has, connected in parallel, a throttle diaphragm 60, a differential pressure regulating valve 62 and a differential pressure measuring arrangement 64. The differential pressure measuring arrangement 64 does not necessarily have to be provided, since the pressure across the throttle diaphragm 60 can also be determined, at least in order of magnitude, from the measurement signals of the pressure measuring arrangements 28 and 38. The following considerations are helpful in the dimensioning of the throttle diaphragm 60. In the closed state of the pressure regulating valve 62, a defined maximum differential pressure builds up between the pressure regions 1 and 2. The dimensioning of the throttle diaphragm, them, is obtained from the maximum permissible height of the melt in the crucible.

If it is assumed, then, that the differential pressure regulating valve closes incorrectly, without a throttle diaphragm 60 there would be no gas flow in the direction of the upper pressure region 1. As a result, the pressure in the lower pressure region 2 would rise, while the pressure in the upper pressure region 1 would fall. There would consequently be a rapid uncontrolled rise in the differential pressure above the crucible 4, which would cause the melt to overflow out of the crucible 4. If, for example, the crucible height amounts to 10 cm, a differential pressure of 10·230 Pa=2300 Pa would cause the melt to overflow (see the following derivation). In this case, it would be beneficial if the throttle diaphragm 60 were dimensioned such that, with the given gas throughflow and with the pressure regulating valve 62 closed, a maximum differential pressure of 2000 Pa builds up. As a result, a differential pressure of 2000 Pa would then build up in the event of an actual failure of the regulating valve or control valve.

More detailed considerations regarding the calculation of the differential pressure are addressed below.

During pulling by the inoculant 12, there is a continuous molten flow causing a dynamic pressure difference which counteracts the static pressure. This gives rise, for the differential pressure which is to be generated via the inert gas, to the following equation:

$$P_{diff} = P_{stat} = P_{dyn}.$$

For the necessary differential pressure between the pressure regions 1 and 2, to support the melt in a static situation, that is to say with a stagnating molten flow, the following equation is obtained:

$$P_{stat} = h * p_{silicon} * g.$$

The static pressure is thus proportional to the height of the melt and to the specific gravity of the silicon. Thus, silicon generates per 1 cm of height of the melt a static pressure of 230 Pa (N/m$^2$), so that, with a height of the melt of 5 cm, approximately 1150 Pa are obtained.

The dynamic pressure fraction is obtained from the following equation:

$$P_{dyn} = v * 8 * \eta * h/R^2.$$

So that this dynamic pressure fraction can be estimated, the following assumption is made: $\eta = 1*10^{-3}$ Pa*s, of the average viscosity of liquid metals at the melting temperature. If then, $6.67 \cdot 10^{-7}$ m$^3$/s is postulated as the molten flow (obtained from the pulling rate 2 mm/min for a rod with a diameter of 150 mm), this results, in the case of an assumed outlet cross section from the crucible of 3 cm$^2$, in a flow velocity $v=2.2*10^{-3}$ m/s. If it is assumed, furthermore, that the hollow-cylindrical orifice of the crucible is critical for the dynamic pressure drop and the height of this portion is assumed to be 2 cm, it can be shown arithmetically that the dynamic pressure fraction lies in the region of 3 mPa, that is to say well below the static pressure.

In practice, however, the dynamic fraction will be higher because the melt flowing out of the crucible impinges on to the crystallization zone, that is to say the viscosity of the melt rises very quickly in this region and the molten flow is thus braked.

Thus, in an overall consideration of the differential pressure, with an assumed melt level of 5 cm and with a molten flow of $6.67 \cdot 10^{-7}$ m$^3$/s, a theoretical value of at most 1150 Pa would be obtained, which in reality will be lower because of the viscosity rise.

Figure 3:
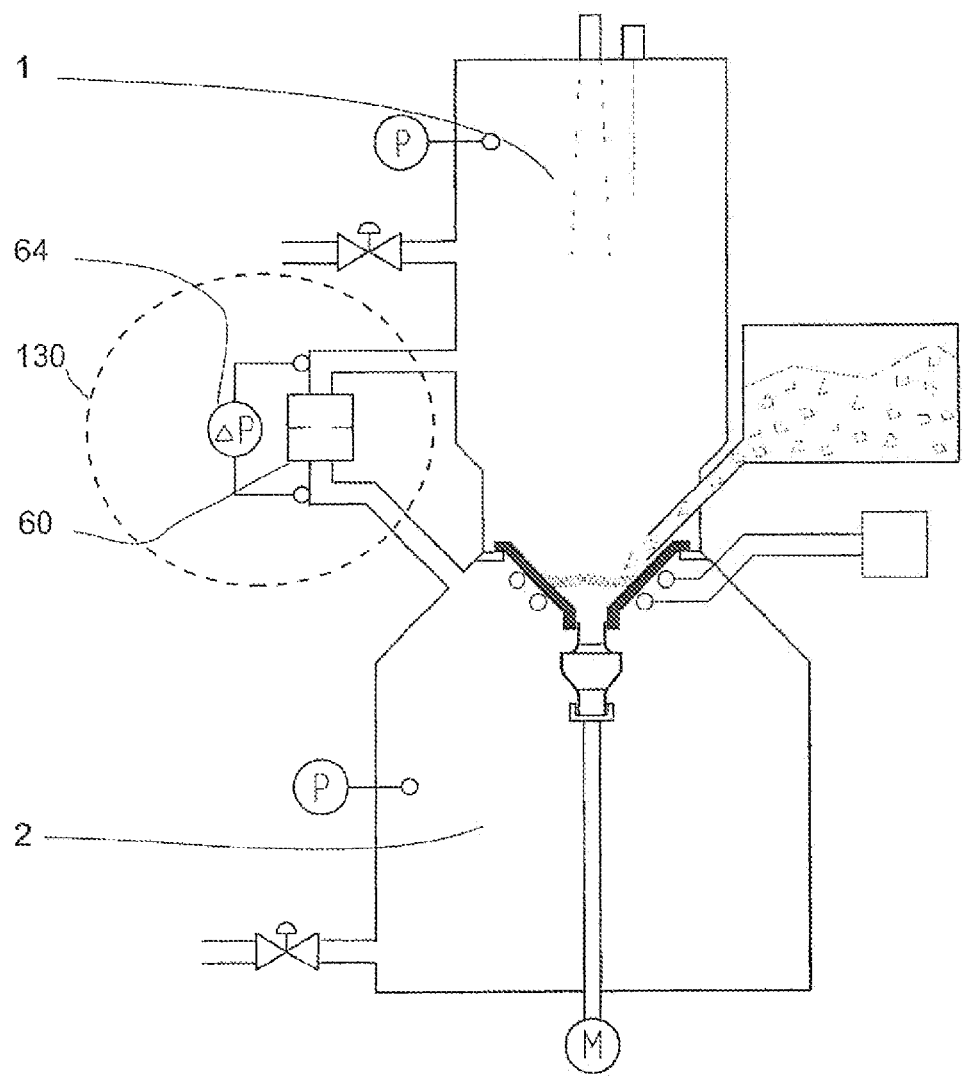
FIG. 3 shows a diagrammatic illustration of a device for material production according to the second exemplary embodiment.

FIG. 3 shows a device according to the invention corresponding to a second exemplary embodiment, which differs from the device of the first exemplary embodiment merely in the configuration of the connecting system 130. The connecting system 130 according to the second exemplary embodiment has the throttle diaphragm 60 and the differential pressure measuring arrangement 64 connected in parallel. The differential pressure regulating valve 62 is not provided. On account of the above considerations regarding the configuration of the throttle diaphragm in the first exemplary embodiment, in this case differential pressure regulation takes place via a variable mass flow of inert gas. The reduced outlay in terms of apparatus is advantageous in this case. However, there are adverse influencing variables here, in that the gas stream cannot be kept constant and therefore adverse influences relevant to the process arise.

Figure 4:
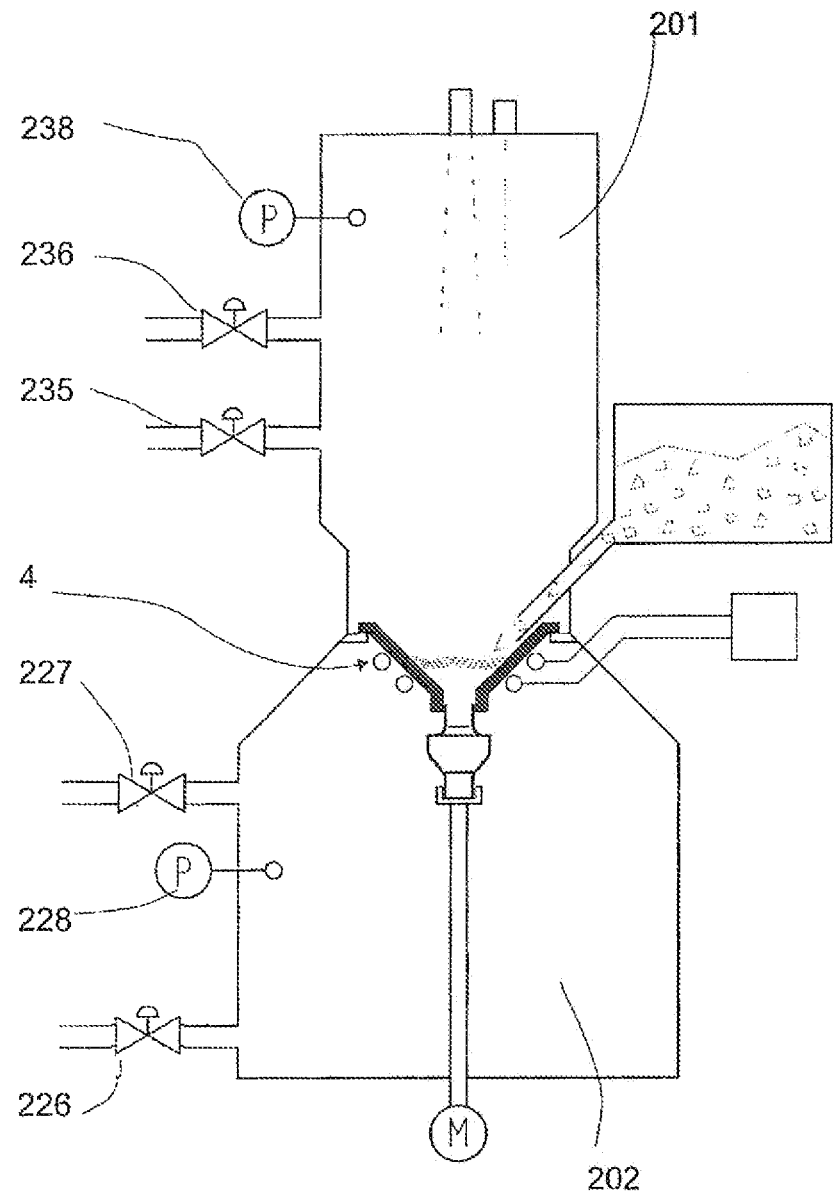
FIG. 4 shows a diagrammatic view of elements of a device for material production according to the third exemplary embodiment.

The device according to the invention shown in FIG. 4 and corresponding to the third exemplary embodiment differs from those of the first and second exemplary embodiments in that there is no connecting system provided between the pressure regions 201 and 202. The configuration of the device otherwise corresponds to those in the first and the second exemplary embodiments.

Instead of the connecting system, in the third exemplary embodiment, an inlet control valve 226 and an outlet control valve 227 are provided toward the lower pressure region 202 and an inlet control valve 235 and an outlet control valve 236 are provided toward the upper pressure region 201. As in the first and the second exemplary embodiments, pressure measuring arrangements 228, 238 are provided in the third exemplary embodiment. The setting of the height of the melt in the crucible 4 takes place in the third exemplary embodiment via activation of the valves 226, 227 and 235, 236 or of at least two of these. In this case, the measurement variables used are the initial variables of the pressure measuring arrangements 228, 238.

An illustrative description of the method according to the invention for producing material having a monocrystalline or multicrystalline structure is given below by the example of the first exemplary embodiment. This method may by adaptation, be applied appropriately to the modification of the second and the third exemplary embodiments and is not restricted to silicon, but may also be applied correspondingly to the other materials mentioned above.

Commencement of the Remelting Operation

The commencement of the remelting operation starts with evacuation of the plant and with subsequent flooding of the plant with the inert gas. The setting of a defined mass flow takes place via the lower control valve 26. Setting of the desired pressure range in the overpressure range takes place on the upper pressure region via the pressure control valve 38. The differential pressure regulating valve 62 is in this case in the closed position.

The pulling shaft is subsequently moved, together with the mounted inoculant 12, upward until the inoculant 12 closes the outlet 10 of the crucible 4. Should residual silicon still be located in the crucible 4 on account of a preceding pulling operation, the inoculant 12 is moved manually into the crucible 4 to an extent such that collision with the crucible or with the residual melt located in the crucible is prevented.

Partial filling of the crucible 4 is subsequently carried out via the reservoir 6, so that a melt level in the crucible 4 below the desired target level value can be expected. In this case, manual control of the delivery of the silicon takes place via the plant operator. The heating of the silicon to approximately 600° C. is carried out via an auxiliary heat source, not illustrated in FIG. 1. This intermediate temperature is necessary for electromagnetic coupling between the induction heating and silicon. After the intermediate temperature of approximately 600° C. or a comparable value for other material has been reached, melting is continued via the induction heating by means of the associated induction coil 18, temperature regulation taking place via the temperature signal sensor 44 designed as a pyrometer.

After the melting temperature is reached, that is to say, in the ease of silicon, 1430° C., and with melting concluded, a gas-tight plug is formed in the crucible 4 on account of the silicon melt. This state can be recognized, on the one hand, in that the plant operator notices this state, or it can be inferred from the image processing system and the pyrometer.

Alternatively to this, this state will also be noticed via differential pressure measurement by the recognition of a certain pressure rise, since the overall flow resistance between the two pressure regions 1 and 2 increases.

When the process state of the formation of a gas-tight plug is recognized, the differential pressure regulation and melt level regulation are activated. Subsequent automatic conveyance of further silicon takes place, until the desired melt height is reached in the crucible 4. This desired melt height is detected via the camera arrangement 42 and the image processing system. The differential pressure must satisfy the condition $P_{stat}=h*p_{silicon}*g$.

Melting on of the inoculant 12 occurs during the melting operation, and the cone is pulled manually to the target diameter of the silicon rod by the plant operator. When the desired target diameter is reached, the pulling operation is continued automatically.

During the operation of pulling the rod, diameter regulation and temperature regulation are active. The differential pressure and melt level in the crucible 4 are regulated to constant desired values.

So that a desired target length is achieved, the reservoir must store sufficient silicon particles. The reason at the background of this is that refilling of the reservoir during operation would be an undesirable process disturbance which could result in a possible interruption of the molten flow.

The pulling operation is ended when the rod has reached a desired length on the inoculant 12. Manual tapering of the diameter of the silicon rod is then carried out by increasing the speed of advance of the drive system 16. After the pulling of the cone has ended, the particle feed via the conveying arrangement 8 is stopped. A pressure rise in the lower pressure region 2 and a cutback of heating by the induction coil 18 take place. The silicon remaining in the crucible subsequently solidifies and a sealing plug is formed in the crucible.

By means of this method according to the invention, which was described above merely by way of example for the generation of monocrystalline silicon, monocrystalline silicon of high purity can be produced. The above method can also be applied to the production of other materials mentioned above.

Figure 5:
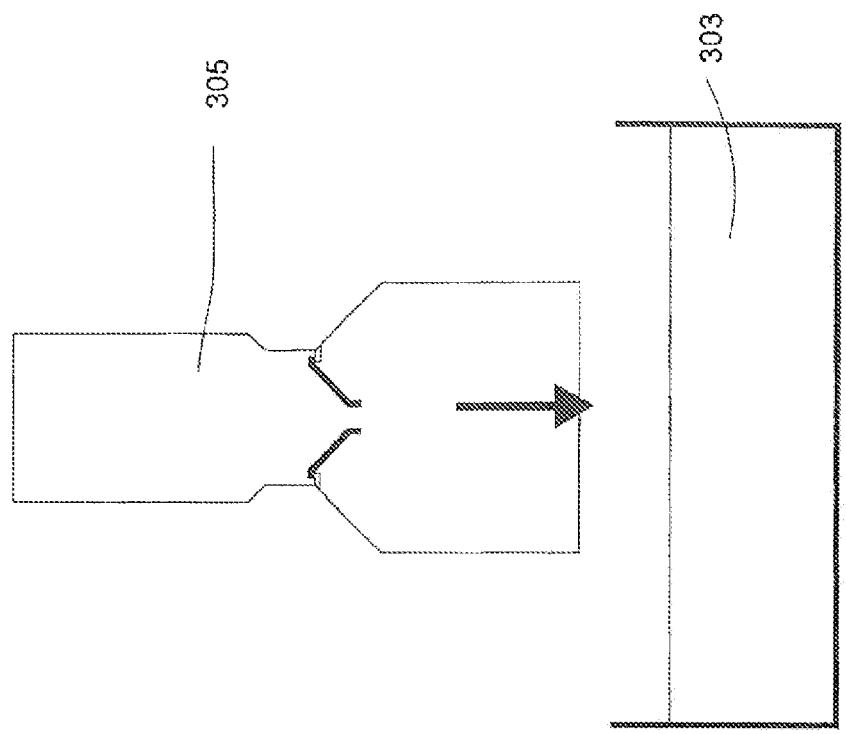
FIG. 5 shows a diagrammatic view of elements of a device for material production according to the fourth exemplary embodiment.
Figure 6:
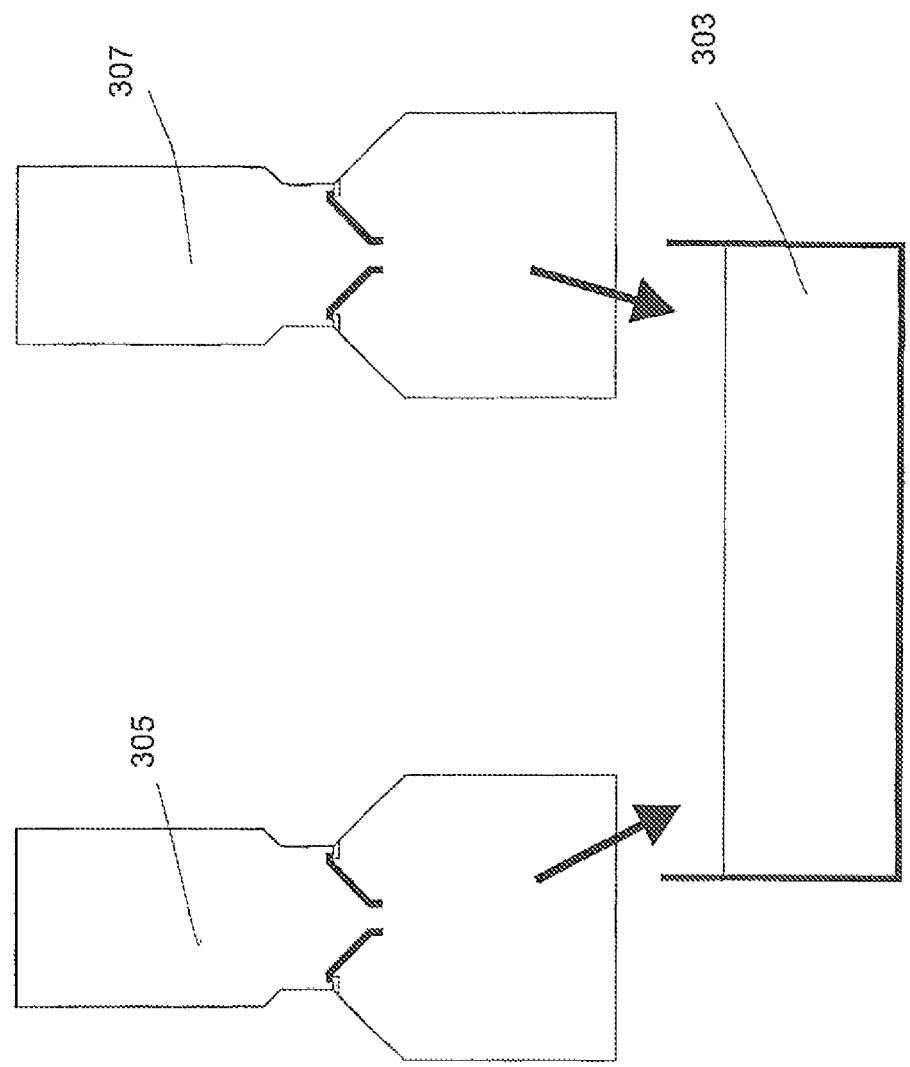
FIG. 6 shows a diagrammatic view of elements of a device for material production according to the fifth exemplary embodiment.

FIGS. 5 and 6 show a device and a method corresponding to a fourth and a fifth exemplary embodiment. What these exemplary embodiments have in common is that the location where the inoculant is pulled out of the container is not the crucible, above which the pressure difference prevails, but instead a container 303 into which the melt is conveyed after it has left the crucible 4. The advantage of a configuration of this type is that the container 303 can have a large volume and the inoculant can be introduced into it counter to the direction of gravitational action. Thus, not only diameters of, for example, 150 or 200 mm can be achieved, which are advantageous in zonal pulling but the diameters of, for example, 300 mm or even 450 mm, obtained in crucible pulling, can be achieved. Since the container 303 does not have to be a continuous flow crucible, even masses of, for example, 1 t can be accommodated by this. The crucible 4 in the fifth and the sixth exemplary embodiment thus has the function of melting.

According to the invention, a device and a method for producing materials having a monocrystalline or multicrystalline structure are provided, in which a container is arranged between two pressure regions and setting of the height of the melt in the container takes place via the setting of the differential pressure between the pressure regions. As a result, even particulate material can be fed continuously to the container and melted uniformly. Delivery material with high purity can also be drawn off from the container.

Although the best mode contemplated by the inventors of carrying out the present invention is disclosed above, practice of the above invention is not limited thereto. It will he manifest that various additions, modifications and rearrangements of the features of the present invention may be made without deviating from the spirit and the scope of the underlying inventive concept.

The invention claimed is:

1. A method for producing material having a monocrystalline or multicrystalline structure, with the steps:
   a) introduction of the particulate material mixture into an inlet of a container configured as a crucible,
   b) heating of the material mixture in the melting zone of the container by means of an induction coil, in order to provide a melt of the material mixture, the container being designed conically in order to ensure a subsequent flow of the melt of the material mixture toward an outlet of the container, and the induction coil being arranged outside the container and serving to surround the container essentially in the form of a ring in the conical container portion, the material mixture in the melting zone of the container being supported statically via a pressure difference between the inlet and the outlet of the container, the pressure difference being proportional to the height of the melt, the static support taking place between two chambers which are separated by the container and between which the pressure difference prevails, either each of the chambers being regulated separately in terms of pressure or these chambers being connected to one another by regulation of the pressure difference
   c) contacting the material mixture, in the melting zone, with an inoculating crystal, at or adjacent to the outlet of the container; and
   d) pulling of the material mixture out of the melting zone in order to form the monocrystalline or multicrystalline structure.

2. A device for producing material having a monocrystalline or multicrystalline structure, with:
   a container which is designed as a crucible and has an inlet, via which a particulate material mixture can be introduced, and which is designed conically, in order to ensure a subsequent flow of a melt of the material mixture toward an outlet of the container,
   a heating arrangement, by means of which the material mixture can be heated in a melting zone of the container by means of an induction coil, which is arranged outside the container and serves to surround the container essentially in the form of a ring in the conical container portion, in order to provide a melt of the material mixture,
   a pressure generation arrangement for generating a pressure difference between the inlet and the outlet of the container, via which pressure difference the material mixture can be supported statically in the melting zone of the container, the pressure difference being proportional to the height of the melt, the static support taking place between two chambers which are separated by the container and between which the pressure difference prevails, either each of the chambers being regulated separately in terms of pressure or these chambers being connected to one another by the regulation of pressure difference; and an inoculant, via which the material mixture can be contacted at or adjacent to an outlet of the container and via which the material mixture can be pulled out of the melting zone in order to form the monocrystalline of multicrystalline structure.

3. The device as claimed in claim 2, the material being a semiconducting material, a connecting semiconductor and/or a metal alloy.

4. The device as claimed in claim 2, the measurement of the volume of the material in the container taking place via the measurement of the diameter of the material in the container, so that a camera arrangement can be used for the volume measurement.

5. A method for producing material having a monocrystalline and multicrystalline structure, with the steps:
   a) introduction of the particulate material mixture into an inlet of a container configured as a crucible,
   b) heating of the material mixture in the melting zone of the container by means of an induction coil, in order to provide a melt of the material mixture, the container being designed conically in order to ensure a subsequent flow of the melt of the material mixture toward an outlet of the container, and the induction coil being arranged outside the container and serving to surround the container essentially in the form of a ring in the conical container portion, the material mixture in the melting zone of the container being supported statically via a pressure difference between the inlet and the outlet of the container, the pressure difference being proportional to the height of the melt, the static support taking place between two chambers which are separated by the container and between which the pressure difference prevails, either each of the chambers being regulated separately in terms of pressure or these chambers being connected to one another by regulation of the pressure difference;
   c) contacting of the material mixture, preferably in the melting zone, with an inoculant, preferably an inoculating crystal, at or adjacent to the outlet of the container; and
   d) pulling of the inoculating crystal out of the melting zone in order to form a monocrystalline semiconducting silicon rod.

6. A device for producing material having a monocrystalline or multicrystalline structure, with:
   a container which is designed as a crucible and has an inlet, via which a particulate material mixture can be introduced, and which is designed conically, in order to ensure a subsequent flow of a melt of the material mixture toward an outlet of the container,
   a heating arrangement, by means of which the material mixture can be heated in a melting zone of the container by means of an induction coil, which is arranged outside the container and serves to surround the container essentially in the form of a ring in the conical container portion, in order to provide a melt of the material mixture,
   a pressure generation arrangement for generating a pressure difference between the inlet and the outlet of the container, via which pressure difference the material mixture can be supported statically in the melting zone of the container, the pressure difference being proportional to the height of the melt, the static support taking place between two chambers which are separated by the container and between which the pressure difference prevails, either each of the chambers being regulated separately in terms of pressure or these chambers being connected to one another by the regulation of pressure difference; and
   an inoculant, via which the material mixture in the form of semiconductor material, preferably in the melting zone, can be contacted at or adjacent to an outlet of the container and via which semiconductor material can be pulled out of the melting zone.

* * * * *